(12) United States Patent
Lee et al.

(10) Patent No.: US 12,269,964 B2
(45) Date of Patent: Apr. 8, 2025

(54) PROTECTIVE COATING COMPOSITION FOR ELECTRONIC BOARD AND METHOD OF PREPARING SAME

(71) Applicants: Hyundai Motor Company, Seoul (KR); Kia Corporation, Seoul (KR)

(72) Inventors: Tae Seung Lee, Gyeonggi-do (KR); Yong Cheol Kim, Seoul (KR); Chang Su Yoo, Gyeonggi-do (KR); Jun Ho Lee, Gyeonggi-do (KR); Eun Su Yun, Chungcheongnam-do (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 72 days.

(21) Appl. No.: 17/969,096

(22) Filed: Oct. 19, 2022

(65) Prior Publication Data
US 2023/0119754 A1    Apr. 20, 2023

(30) Foreign Application Priority Data

Oct. 20, 2021 (KR) .......................... 10-2021-0140451

(51) Int. Cl.
| | |
|---|---|
| C09D 175/04 | (2006.01) |
| C08J 7/052 | (2020.01) |
| C09D 7/20 | (2018.01) |
| C09D 7/61 | (2018.01) |
| C09D 7/65 | (2018.01) |
| C09D 183/04 | (2006.01) |
| H05K 3/28 | (2006.01) |

(52) U.S. Cl.
CPC ............ *C09D 175/04* (2013.01); *C08J 7/052* (2020.01); *C09D 7/20* (2018.01); *C09D 7/61* (2018.01); *C09D 7/65* (2018.01); *C09D 183/04* (2013.01); *H05K 3/282* (2013.01); *C08J 2375/04* (2013.01); *C08J 2383/04* (2013.01)

(58) Field of Classification Search
CPC .......... C09D 175/04; C09D 7/65; C09D 7/61; C09D 7/20; C09D 183/04; C08J 7/052; H05K 3/282
See application file for complete search history.

(56) References Cited

U.S. PATENT DOCUMENTS 9,932,493 B2   4/2018 Ekin et al.
2019/0330418 A1* 10/2019 Jain ..................... C08G 63/685

FOREIGN PATENT DOCUMENTS

CN          108949006 B    6/2020

* cited by examiner

*Primary Examiner* — John E Uselding
(74) *Attorney, Agent, or Firm* — Fox Rothschild LLP

(57) ABSTRACT

Disclosed are a protective coating composition for an electronic board and a method for preparing the same. The protective coating composition includes urethane-modified alkyd resins that can prevent poor grounding caused by low molecular weight siloxanes generated in a conventional silicone-type coating compositions and preventing performance degradation caused by tin whisker growth while lowering emissions of volatile organic compounds (VOCs).

19 Claims, No Drawings

PROTECTIVE COATING COMPOSITION FOR ELECTRONIC BOARD AND METHOD OF PREPARING SAME

CROSS REFERENCE TO RELATED APPLICATION

The present application claims priority to Korean Patent Application No. 10-2021-0140451, filed Oct. 20, 2021, the entire contents of which is incorporated herein for all purposes by this reference.

TECHNICAL FIELD

The present invention relates to a protective coating composition for an electronic board and a method for preparing the same. Particularly, the protective coating composition may include one or more kinds of urethane-modified alkyd resins, so the coating composition may not have problems occurring in conventional silicone-type coating compositions. For example, poor grounding due to low molecular weight siloxane and performance degradation due to tin whisker growth may be prevented and a surface may be protected from external environments such as high temperature and humidity, corrosive conditions, and contamination. Further, emission of volatile organic compounds (VOCs) may be prevented during the application or manufacturing of the protective coating composition.

BACKGROUND

In the related art, a coating layer has been formed by applying a silicone type coating composition such as an alkoxysilane on an electronic board and then curing same by moisture in the air. However, in the silicone type coating composition, low molecular weight siloxane may be generated during the synthesis and polymerization process, which is coated to places where electrical properties such as grounding of electronic devices are required, causing problems such as grounding failure and device malfunction.

In addition, a coating composition based on a water-soluble solution that is eco-friendly has excellent coating performance. However, the water-soluble solution may be difficult to ensure electrical insulation until complete drying and may be coated as a thick film on the part of the electronic board, such as a hole. If the electrical operation needs to be evaluated immediately after coating, leakage current occurs, and the product is judged as defective, making it difficult to use it for controller parts that require high reliability.

On the other hand, the coating composition for an electronic board should be a one-component type product without a change in viscosity that can be used continuously during the production process of the electronic board or even during a rest period. The one-component type product may include moisture curing type, oxidation-curing type, and anaerobic curing type products in polymerization through curing. In addition to this curing type product, a polyolefin-based coating solution is applied by spray coating without curing and forms a film as the solvent in the coating solution is volatilized. This non-curing type product may include a polymer material from the beginning, so it only ranges from tens to hundreds of thousands of molecular weights compared to the curing type with a molecular weight of several million or more, so that the non-curing type product may be vulnerable at high temperatures, difficult to form an even film. The amount of volatile VOC is large, so it may not be eco-friendly.

For example, as a coating composition for an electronic board, an oxidation-curing type solution containing an alkyd resin has been widely used. An oxidation-curing type coating composition may be prepared by using a method in which a double bond of the resin is activated when it meets proton ($H^+$), reacts with oxygen ($O_2$) in the air, may form a substituent containing oxygen elements in the resin, and may bond again between these resins and polymerizes a polymer.

On the other hand, general oxidation-curing type urethane alkyd resin has been synthesized by dehydration reaction at high temperature with alcohols and vegetable oil or fatty acid. In this case, xylene, toluene, etc., which include BTX harmful to the human body, have been essentially used to dissolve the resin.

In the related arts, other alkyd resin synthesis methods, which may reduce the molecular weight of the resin and reduce the number of double bonds to reduce the harmful acetaldehyde and formaldehyde generated during the reaction or convert to solvent-free resin, have been used. In this case, curing may be delayed, and new problems such as stickiness occurs during curing, and poor workability occurs.

In addition, a metal catalyst such as a metal dryer has been used for curing an oxidation-curing type coating composition, including an alkyd resin, but excessive aldehyde may be generated in this process. Particularly, a first group dryer such as a metal dryer combining cobalt and zirconium or a metal dryer combining manganese and zirconium is used, but the metal dryer breaks a double bond in the resin composition to generate aldehydes. A method has been proposed to minimize the amount of addition or to use a second group dryer such as lead, bismuth, barium, zirconium, aluminum, and strontium, but these methods may have a problem in that the curing rate was slow, so surface stickiness occurred due to delay in drying after coating.

SUMMARY

In preferred aspects, provided is a coating composition for an electronic board that dries quickly, has excellent adhesion to an electronic board, and can be cured at room temperature in a one-component type, and a method for producing the same.

The objective of the present invention is not limited to the objective mentioned above. The objectives of the present invention will become more apparent from the following description and will be realized by means and combinations thereof recited in the claims.

In an aspect, provided is a protective coating composition for an electronic board. The protective coating composition (the "composition") may include: a first resin including a first urethane-modified alkyd resin; a second resin including a second urethane-modified alkyd resin and a silicone resin; a solvent including carbon-based solvents, ketone-based solvents, alcohol-based solvents, or combinations thereof; fluidity control agent; and a metal catalyst. The protective coating composition may optionally include a flame retardant.

The first resin and the second resin may be the same or different type. In certain aspect, the first and second resins are different, these resins are different in physical or chemical properties such as polydispersity index (PDI), physical properties of heat resistance, curing density, and stability against high temperature and high humidity. For instance, the first resin and second resin may have polydispersity values that differ by 2, 3, 5, 8, 10, 15, 20, 25 or 40 percent or more; and/or the first resin and second resin may have heat or thermal resistance values (K/W) that differ by 2, 3, 5, 8, 10, 15, 20, 25 or 40 percent or more; and/or the first resin and second resin may have curing density values that differ by 3, 5, 8, 10, 15, 20, 25 or 40 percent or more; or other property may differ by 2, 3, 5, 8, 10, 15, 20, 25 or 40 percent or more between the first resin and second resin.

Further, the first urethane-modified alkyd resin and the second urethane-modified alkyd resin may be the same or different type, e.g., in physical or chemical properties, or functional groups or compositions thereof. For example, physical properties of heat resistance, curing density, and stability against high temperature and high humidity may be different in the first urethane-modified alkyd resin and the second urethane-modified alkyd resin because of the components and monomer compositions. For example, the first urethan-modified alkyd resin and the second urethane-modified alkyd resin may differ by 2, 3, 5, 8, 10, 15, 20, 25 or 40 percent or more with respect to any one or more of such physical properties.

The first urethane-modified alkyd resin may be obtained by polymerizing an alkyd resin obtained by polymerizing fatty acid, polybasic acid, and polyhydric alcohol and isocyanate.

The first resin may have an acid value of about 25% to 35% and a mass average molecular weight of about 10,000 g/mol to 15,000 g/mol.

The first resin may have a Gardner viscosity of W to Z and solid content of about 50% to 80% by weight based on the total weight of the first resin.

The second resin may have an acid value of about 3% to 10% and a mass average molecular weight of about 8,000 g/mol to 30,000 g/mol.

The second resin may have a Gardner viscosity of W to Z1 and solid content of about 60% to 90% by weight.

The second resin may include an amount of about 10% to 15% by weight of an urethane and an amount of about 20 parts by weight to 40 parts by weight of a silicone resin to 100 parts by weight of an alkyd resin.

The carbon-based solvent may include naphthene-based hydrocarbons, paraffin-based hydrocarbons, or combinations thereof.

The carbon-based solvent may have a flash point of about 0° C. to 80° C.

The carbon-based solvent may include a naphthene-based hydrocarbon having a volatilization temperature of about 40° C., about 48° C., or about 56° C.

The carbon-based solvent may include a paraffin-based hydrocarbon, for example, C10-C12 isoparaffins, C12-C13 isoparaffins, C10-C13 normal paraffins, or combinations thereof.

The ketone-based solvent may include methyl ethyl ketone, methyl isobutyl ketone, acetone, dimethyl carbonate, or combinations thereof.

The alcohol-based solvent may include isopropyl alcohol, methanol, methoxy propanol, or combinations thereof.

The alcohol-based solvent may have a dielectric constant of about 5 or greater.

The fluidity control agent may include a micronized calcium dispersion, urea-modified polyimide, or combinations thereof.

The metal catalyst may include cobalt naphthenate, calcium octoate, zirconium octoate, or combinations thereof.

The composition may include: an amount of about 20% to 60% by weight of the first resin; an amount of about 8% to 60% by weight of the second resin; an amount of about 5% to 35% by weight of the carbon-based solvent; an amount of about 1% to 3% by weight of the ketone-based solvent; an amount of about 0% to 15% by weight of alcohol-based solvent; an amount of about 0% to 0.2% by weight of UV photosensitizes, an amount of about 0% to 3% by weight of fluidity control agent; an amount of about 0% to 3% by weight of the surface conditioning resin; an amount of about 0.2% to 3% by weight of the antifoaming agent; and an amount of about 0.3% to 2% by weight of the metal catalyst, based on the total weight of the composition.

In an aspect, provided is method of producing the coating composition for an electronic board as described above. The method may include steps: preparing a first resin by (i) polymerizing fatty acid, polybasic acid, and polyhydric alcohol to obtain an alkyd resin, and (ii) polymerizing the alkyd resin and an isocyanate to prepare a urethane-modified alkyd resin; preparing a second resin by (i) polymerizing fatty acid, polybasic acid, and polyhydric alcohol to obtain an alkyd resin, (ii) polymerizing the alkyd resin and isocyanate to prepare a urethane-modified alkyd resin, and then (iii) polymerizing the urethane-modified alkyd resin with a silicone resin; and adding the first resin, the second resin, the fluidity control agent and the metal catalyst to a solvent including a carbon-based solvent, a ketone-based solvent, an alcohol-based solvent, or a combination thereof and stirring the mixture.

Also provided is a method of manufacturing an electronic board as described herein. The method may form a coating layer on the substrate by applying the protective coating composition on a substrate and drying applied protective coating composition, e.g., naturally or by air.

Further, provided is a method of manufacturing an electronic board as described herein. The method may form a coating layer on the substrate by applying the protective coating composition to the substrate and curing the applied protective coating composition by applying hot air.

According to various exemplary embodiments of the present invention, a printed circuit board may be coated with a protective coating composition on a mounted electronic board satisfying physical and chemical properties and electrical properties thereof may be obtained even under severe temperature and humidity conditions.

According to various exemplary embodiments of the present invention, substances such as odors and VOCs that are harmful to the working environment generated in the process of forming the coating layer on the electronic board may be substantially reduced.

According to various exemplary embodiments of the present invention, a predetermined thickness can be ensured in the vertical part coating, which is an essential condition for coating uniformity, hence satisfying the coating requirement of the microprocessor frame rod part.

The effects of the present invention are not limited to the effects mentioned above. It should be understood that the effects of the present invention include all effects that can be inferred from the following description.

Other aspects of the invention are disclosed infra.

DETAILED DESCRIPTION

The above objectives, other objectives, features, and advantages of the present invention will be easily understood through the following preferred embodiments in conjunction with the accompanying drawings. However, the present invention is not limited to the embodiments described herein and may be embodied in other forms. Instead, the embodiments introduced herein are provided so that the disclosed content may be thorough and complete, and the spirit of the present invention may be sufficiently conveyed to those skilled in the art.

Similar reference numerals were used for similar components while explaining each drawing. In the accompanying drawings, the dimensions of the structures are enlarged than the actual size for clarity of the present invention. Terms such as first, second, etc., may be used to describe various elements, but the elements should not be limited by the terms. The above terms are used only for the purpose of distinguishing one component from another. For example, without departing from the scope of the present invention, a first component may be referred to as a second component, and similarly, a second component may also be referred to as a first component. The singular expression includes the plural expression unless the context clearly dictates otherwise.

In the present specification, it should be understood that the term "including" or "have" is intended to specify that features, numbers, steps, operations, components, parts, or a combination of them are described in the specification and does not preclude the presence or addition of one or more other features, numbers, steps, operations, elements, or combinations thereof. In addition, when a part such as a layer, film, region, plate, etc. is said to be "on" another part, this includes not only "directly above" the other part, but also the case where there is another part between them. Conversely, when a part such as a layer, film, region, plate, etc., is said to be "below" the other part, this includes not only the case where the other part is "directly below", but also the case where there is another part between them.

Unless otherwise specified, all numbers, values, and/or expressions expressing quantities of ingredients, reaction conditions, polymer compositions, and formulations used herein contain all numbers, values, and/or expressions in which such numbers essentially occur in obtaining such values, among others. Since they are approximations reflecting various uncertainties in the measurement, it should be understood as being modified by the term "about" in all cases. Further, unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Also, where the present invention discloses numerical ranges, such ranges are continuous and inclusive of all values from the minimum to the maximum inclusive of the range, unless otherwise indicated. Furthermore, when such ranges refer to integers, all integers inclusive from the minimum to the maximum inclusive are included, unless otherwise indicated. For example, the range of "5 to 10" will be understood to include any subranges, such as 6 to 10, 7 to 10, 6 to 9, 7 to 9, and the like, as well as individual values of 5, 6, 7, 8, 9 and 10, and will also be understood to include any value between valid integers within the stated range, such as 5.5, 6.5, 7.5, 5.5 to 8.5, 6.5 to 9, and the like. Also, for example, the range of "10% to 30%" will be understood to include subranges, such as 10% to 15%, 12% to 18%, 20% to 30%, etc., as well as all integers including values of 10%, 11%, 12%, 13% and the like up to 30%, and will also be understood to include any value between valid integers within the stated range, such as 10.5%, 15.5%, 25.5%, and the like.

In an aspect, the coating composition for an electronic board may include: a first resin including a first urethane-modified alkyd resin; a second resin including a second urethane-modified alkyd resin and a silicone resin; a solvent including at least one selected from the group consisting of a carbon-based solvent, a ketone-based solvent, an alcohol-based solvent, and combinations thereof; a fluidity control agent; and a metal catalyst. The coating composition may optionally include a flame retardant.

The electronic board is used for small electronic devices such as computers and communication equipment, home appliances such as refrigerators and air conditioners, or automobiles, and may include a printed circuit board and the like.

The coating composition may be coated on the electronic board to form a coating layer to physically and chemically protect the electronic board.

Hereinafter, each component of the coating composition will be described in detail.

The first resin may be configured for physical properties, such as stability against high temperature and high humidity, and maintaining properties of a coating film for a curved part such as a lead part of an electronic board. The first resin may include a first urethane-modified alkyd resin.

The first resin may be the urethane-modified alkyd resin obtained by reacting an alkyd resin with isocyanate. For example, the first resin may be a urethane-modified resin by polymerizing an alkyd resin obtained by polymerizing fatty acid, polyhydric acid, and polyhydric alcohol with isocyanate. An exemplary method for preparing the first resin will be described later.

The fatty acid may suitably include at least one selected from the group consisting of soybean oil fatty acid, dehydrated castor oil fatty acid, linseed oil fatty acid, and combinations thereof.

The polybasic acid may suitably include at least one selected from the group consisting of phthalic anhydride, isophthalic acid, unsaturated basic acid, maleic anhydride, fumaric acid, and combinations thereof.

The polyhydric alcohol may suitably include at least one selected from the group consisting of diethylene glycol, dipropylene glycol, glycenyl, trimethylolpropane, 1,3 butylene glycol, dipentaerythritol, pentaerythritol, and combinations thereof.

The isocyanate may suitably include at least one selected from the group consisting of toluene diisocyanate (TDI), hexamethylene diisocyanate (HMDI), isophorone diisocyanate (IPDI), xylylene diisocyanate (XDI), and combinations thereof.

The first resin may suitably include an amount of about 10 to 20 parts by weight of the isocyanate based on 100 parts by weight of the alkyd resin. When the content of the isocyanate is within the greater than the above content, the reactivity and non-yellowing properties of the alkyd resin and the isocyanate may be implemented at the desired level.

The first resin may have an acid value of about 25% to 35% and a mass average molecular weight of about 10,000 g/mol to 15,000 g/mol.

The first resin may have a Gardner viscosity of level W to Z and solid content of about 50% to 80% by weight based on the total weight of the first resin. Particularly, the optimal viscosity may be Y to Y+ of the Gardner viscosity, and the preferred solid content may be about 60 to 70% by weight based on the total weigh of the first resin.

The coating composition may include an amount of about 30% to 50% by weight of the first resin, based on the total weight of the coating composition. When the content of the first resin is less than about 30% by weight, there may be a problem in that the surface of the coating layer is dried slowly or the coating layer is insufficiently coated on the lead part of the electronic substrate. When the content of the first resin is greater than about 50% by weight, the coated layer may be dried too fast to control air bubbles generated during work, and it may be difficult to implement the desired color.

The second resin is configured for physical properties of heat resistance, curing density, and stability against high temperature and high humidity. The second resin may be prepared by polymerizing a second urethane-modified alkyd resin and a silicone resin. An exemplary method of preparing the second resin will be described later.

The second urethane-modified alkyd resin may be the same as or different from the first urethane-modified alkyd resin of the first resin, but the same as that of the first resin may be used in consideration of miscibility and the like.

Since the second resin is prepared by polymerizing a second urethane-modified alkyd resin and a silicone resin having excellent heat resistance, the heat resistance of the coating layer, including the second resin, is improved. The silicone resin may include one or more of a methyl-based silicone resin, a phenyl-based silicone resin, a phenyl methyl-based silicone resin, a phenyl ethyl-based silicone resin, a phenyl propyl-based silicone resin, and the like. Preferably, the silicone resin may include a phenyl propyl-based silicone resin having an aromatic structure and excellent heat resistance. For example, it is appreciated that the silicone resin may be supplied with DC-3074, DC-3037, Z-6018, and the like of Dow Corning Co., Ltd.

The second resin may include an amount of about 20 parts to 40 parts by weight of the silicone resin in a residual hydroxyl group in 100 parts by weight of the second urethane-modified alkyd resin containing an amount of about 10% to 15% by weight of the urethane resin. When the content of the silicone resin is within the range, an appropriate level of thermal resistance may be provided without harming the physical properties of the urethane-modified alkyd resin.

The second resin may have an acid value of about 3% to 10% and a mass average molecular weight of about 8,000 g/mol to 30,000 g/mol.

The second resin may have a Gardner viscosity of level W to Z1, and solid content of about 60% to 90% by weight.

The coating composition may include an amount of about 12% to 30% by weight of the second resin, based on the total weight of the coating composition. When the content of the second resin is less than about 12% by weight, heat resistance may decrease, or the smoothness of the coating layer may be insufficient, and when it is greater than about 30% by weight, there may be a problem in that the drying rate is slow or the coating layer is sticky after drying.

Further provided are a coating composition having significantly less VOC emission compared to the related art and a method for producing the same. For example, a carbon-based solvent, a ketone-based solvent, an alcohol-based solvent, and the like may be mixed at an appropriate ratio and used as the solvent for the first resin and the second resin instead of a VOC solvent which is harmful to the human body, such as benzene, toluene, and xylene.

The carbon-based solvent preferably does not include xylene, toluene, benzene, and the like and may include at least one selected from the group consisting of naphthene-based hydrocarbons, paraffin-based hydrocarbons, and combinations thereof. The carbon-based solvent excludes xylene, toluene, benzene, and the like. The naphthene-based hydrocarbon may have a volatilization temperature of about 40° C., about 48° C., about 56° C., and the like. The paraffin-based hydrocarbon may suitably include C10-C12 isoparaffins, C12-C13 isoparaffins, C10-C13 normal paraffins, or the combinations thereof. For example, it is appreciated that the carbon-based solvent may be supplied with ESOL D10 and ESOL P20 of Eil Ind. Co., ISOPAR G and ISOPARH D60 of Exxon Mobil Co., IP Clean LX of Idemitsu Kosan Co., and D-SOL 200, D-SOL 170, and D-SOL 150 of Isu Chemical Co., and the like.

The carbon-based solvent may have a flashpoint of about 0° C. to 80° C. When the flashpoint of the carbon-based solvent is within the above range, workability can be improved, and odor can be reduced.

The coating composition may include an amount of about 10% to 40% by weight of the carbon-based solvent. When the content of the carbon-based solvent is less than about 10% by weight, it may be insufficient to sufficiently defoam bubbles generated during coating, and when it is greater than about 40% by weight, the volatility is too low so that the surface of the coating layer becomes sticky during drying.

The ketone-based solvent may include at least one selected from the group consisting of methyl ethyl ketone, methyl isobutyl ketone, acetone, dimethyl carbonate, and combinations thereof. Preferably, in consideration of harmfulness to the human body, volatilization rate, odor, etc., the ketone-based solvent may include dimethyl carbonate.

The coating composition may include an amount of about 10% to 30% by weight of the ketone-based solvent. When the content of the ketone-based solvent is less than about 10% by weight, the solubility of the first resin and the second resin may decrease, and the viscosity of the coating composition may become too high. The volatilization rate may be slowed so that the coating layer on the lead part of the electronic board may not be properly formed.

The alcohol-based solvent may include at least one selected from the group consisting of isopropyl alcohol, methanol, methoxy propanol, and combinations thereof.

In order to increase the insulation resistance value of the coating layer, the alcohol-based solvent having a dielectric constant of about 5 or greater may be used. However, the alcohol-based solvent should be used in an extremely limited amount in consideration of the harmfulness to the human body and the influence on the insulation resistance value, and the coating composition may include an amount of about 1% to 3% by weight of the alcohol-based solvent. When the content of the alcohol-based solvent is greater than about 3% by weight, the drying rate is slowed, and short-term insulation resistance is not secured so that the electronic board may be judged to be in a poor state in the operation evaluation.

Also provided is a coating composition capable of forming a uniform coating layer. Since a coating layer should be uniformly formed at a part protruding vertically or close to vertical from the substrate, such as a lead part of the electronic substrate, the coating itself may be difficult as a solution having a general fluidity. Therefore, it is necessary to adjust the rheology of a coating composition, and preferably, a fluidity control agent may be added to the coating composition.

The fluidity control agent may suitably include at least one selected from the group consisting of micronized calcium dispersion, urea-modified polyimide, and combinations thereof. For example, it is appreciated that the fluidity control agent may be supplied with 610HV and 609 of PCAS Co., BYK 430, 431, and 7411ES of BYK Co., and the like.

The micronized calcium dispersion may control rheology by creating hydrogen bonds between molecules, and the urea-modified polyimide may control fluidity by strengthening the bonding force between molecules.

The coating composition may include an amount of about 1% to 3% by weight of the fluidity control agent. When the content of the fluidity control agent is less than about 1% by weight, the degree of fluidity adjustment is insignificant, so that the uniformity of the coating layer may not be improved, and when it is greater than about 3% by weight, there may be a problem in that the surface smoothness of the coating layer is insufficient.

Moreover, provided is a coating composition capable of suppressing the amount of aldehyde generated in the process of curing the coating composition into a coating layer. For example, a metal catalyst may be combined with or added to the coating composition.

The metal catalyst is configured to branch the double bond of the first resin and the second resin and polymerize the resin into a polymer by reacting with oxygen in the air. The metal catalyst may include a first group catalyst and a second group catalyst according to the curing rate. The first group catalyst may suitably include cobalt octoate, cobalt naphthenate, manganese octoate, cerium octoate, and the like, and the second group catalyst may include lead octoate, barium octoate, zirconium octoate, and the like.

The first group catalyst may have a high rate of branching the resin, which is helpful in increasing the curing rate but causes side reactions to generate aldehydes such as formaldehyde, acetaldehyde, and acrolein.

The coating composition may be provided with an appropriate curing rate while minimizing the generation of aldehydes by using a mixture of a first group catalyst and a second group catalyst. Preferably, the metal catalyst may include at least one selected from the group consisting of cobalt naphthenate, calcium octoate, zirconium octoate, and combinations thereof.

The coating composition may suitably include an amount of about 1.5% to 2.5% by weight of the metal catalyst. When the content of the metal catalyst is less than about 1.5% by weight, the curing rate may be too slow, and when the content of the metal catalyst is greater than about 2.5% by weight, the viscosity may be too high, and thus excessive air bubbles may be generated, and the amount of aldehyde may be increased.

The coating composition may further include additives such as a UV sensitizer, a surface conditioning agent, an antifoaming agent, and a flame retardant. The amount of the additive is not particularly limited and may be appropriately adjusted at a level that does not impair the intrinsic properties of the coating composition.

Hereinafter, a method for producing the coating composition will be described in detail.

The producing method may include steps: preparing a first resin including a first urethane-modified alkyd resin by (i) polymerizing fatty acid, polybasic acid, and polyhydric alcohol to obtain an alkyd resin, and (ii) polymerizing the alkyd resin and an isocyanate; preparing a second resin by (i) polymerizing fatty acid, polybasic acid, and polyhydric alcohol to obtain an alkyd resin, (ii) polymerizing the alkyd resin and isocyanate to prepare a second urethane-modified alkyd resin, and (iii) polymerizing the second urethane-modified alkyd resin with a silicone resin; and adding and stirring a first resin, a second resin, a fluidity control agent, and a metal catalyst into a solvent including at least one selected from the group consisting of a carbon-based solvent, a ketone-based solvent, an alcohol-based solvent, and combinations thereof.

Preparing the first resin may include: preparing an alkyd resin by a condensation reaction of fatty acid, polybasic acid, and polyhydric alcohol; and preparing a first urethane-modified alkyd resin by reacting the alkyd resin with an isocyanate.

For example, dibutyl tin dilaurylate (DBTDL), which is a tin-based catalyst, may be added to a raw material containing fatty acid, and polyhydric alcohol, and nitrogen is injected while polycondensing at a temperature of about 190° C. to 250° C. to react until the acid value reaches about 10 to 15. Thereafter, a polybasic acid may be injected at a temperature of about 160° C. to 180° C., and the reaction may be performed until the acid value becomes about 55 to 60 to prepare an alkyd resin. At this time, the fatty acid may be used in an amount of about 40% to 60% by weight, the polybasic acid may be used in an amount of about 10% to 20% by weight, and the polyhydric alcohol may be used in an amount of about 10% to 20% by weight based on the total weight of the alkyd resin. The amount of the tin-based catalyst is not particularly limited, but about 0.01 parts to 0.5 parts by weight may be added based on 100 parts by weight of the alkyd resin.

The alkyd resin may be diluted with a solvent such as dimethyl carbonate (DMC) to decrease the temperature and viscosity. When the temperature of the alkyd resin reaches a temperature of about 50° C. to 70° C., an amount of about 10 to 20 parts by weight of isocyanate may be added based on 100 parts by weight of the alkyd resin to perform urethane modification. The first resin may be prepared by performing the reaction until the synthesized urethane-modified alkyd resin has an acid value of about 25% to 35% and a mass average molecular weight of about 10,000 g/mol to 30,000 g/mol. The synthesis may be completed by diluting the hydrocarbon-based solvent so that the Gardner viscosity of the first resin is about Y.

A step of preparing the second resin may include: (i) preparing a second alkyd resin by a condensation reaction of fatty acid, polybasic acid, and polyhydric alcohol; (ii) preparing a second urethane-modified alkyd resin by reacting the alkyd resin with an isocyanate; and (iii) polymerizing the second urethane-modified alkyd resin and the silicone resin.

The preparation of the urethane-modified alkyd resin is the same as the preparation method of the first resin and thus will be omitted. However, in this step, the reaction may be performed until the acid value of the urethane-modified alkyd resin may range from about 25% to about 35%, and the mass average molecular weight may range from about 6,000 g/mol to about 15,000 g/mol.

The temperature of the second urethane-modified alkyd resin may be maintained at about 120° C. to 150° C., and a silicone resin, which is a heat-resistant resin, may be added thereto to cause a reaction. At this time, the content of the silicone resin may be adjusted to about 20 to 40 parts by weight based on 100 parts by weight ratio of the content of the urethane-modified alkyd resin. In addition, as a reaction catalyst, tetraisopropyl titanate (TIPT) may be added in an amount of about 0.01 to 0.05 parts by weight. The reaction may be performed until all of the hydroxyl groups of the silicon resin are removed through titration, but may be preferably such that the acid value of the finally synthesized resin ranges from about 3% to about 10% and the weight average molecular weight ranges from about 8,000 g/mol to about 30,000 g/mol. In addition, the synthesis may be completed by diluting the second resin with a hydrocarbon-based solvent so that the Gardner viscosity may be about Y. The composition is summarized in the following table.

The first resin and the second resin synthesized as described above may be introduced into a solvent together with a fluidity control agent, a metal catalyst, an additive, and the like, and then stirred to prepare a coating composition.

The method for manufacturing an electronic board using the coating composition is not particularly limited, and the coating composition may be coated on the electronic board and then cured by drying (e.g., natural drying, air blowing or the like) or providing hot air to form a coating layer.

EXAMPLE

Hereinafter, exemplary embodiment of the present invention will be described in more detail through examples. The following examples are merely illustrative to help the understanding of the present invention, and the scope of the present invention is not limited thereto.

Examples 1 to 4 and Comparative Examples 1 to 4

Synthesis of the First Resin

A thermometer, a condenser, a stirrer, and a water removal condenser were installed in a 1 L four-necked flask, and a heating device was attached. Here, 50.7 g of dehydrated castor oil fatty acid, 18.1 g of pentaerythritol, and 0.3 g of a tin-based catalyst (DBTDL) were added in order, and a refluxing solvent was added. While injecting nitrogen, the reactant was heated to a temperature of 190° C. to react until the acid value was 10% to 15%. After injecting 14.4 g of phthalic anhydride (PHAn) at a temperature of 165° C., the reactant was reacted at a temperature of 170° C. until the acid value becomes 55% to 60%. When the reaction was completed, 16.4 g of DMC solvent was added and diluted to make 100 parts by weight of an alkyd resin, and then 12 parts by weight of TDI, which was an isocyanate, was added at a temperature of 60° C. After the reaction at a temperature of 70° C. for 2 hours, the reaction was terminated. When the reaction was completed, the reactant was diluted with a diluent IPCLEAN LX solution until the solid content of the reactant was 70%, and the Gardner viscosity was about Y to prepare a first resin.

Synthesis of the Second Resin

A thermometer, a condenser, a stirrer, and a water removal condenser were installed in a 1 L four-necked flask, and a heating device was attached. Here, 49 g of soybean oil fatty acid (SOFA), 20 g of pentaerythritol, and 0.3 g of a tin-based catalyst (DBTDL) were added in this order, and a refluxing solvent was added. While injecting nitrogen, the temperature was heated to a temperature of 190° C. to react until the acid value became 15% to 20%. Then, 16.7 g of phthalic anhydride (PHAn) was injected at a temperature of 165° C., and the temperature was raised to a temperature of 170° C., and the reaction was performed until the OH number became 15% to 25%. When the reaction was completed, 16.3 g of DMC solvent was added to ensure proper fluidity, and 100 parts by weight of an alkyd resin were synthesized. The synthesized alkyd resin was reacted at a temperature of 70° C. for 2 hours by adding 15 g of isocyanate IPDI, which was an isocyanate, at a temperature of 60° C. At this time, the reaction time was adjusted so that the viscosity did not rise too much. When the reaction was completed to some extent, 27 g of Z-6018 as a heat-resistant resin was added together with 0.01 g of tetraisopropyl titanium (TIPT) as a reaction catalyst while raising the temperature to a temperature of 120° C. to 150° C. again to synthesize the second resin. When the reaction was completed, the reactant was diluted with a solution mixed with the dilution solvent IP CLEAN LX and DMC so that the solid content was 70% and the Gardner viscosity was about Y to prepare a second resin.

Compositions of the first and second resins used in Examples and Comparative Examples are shown in Table 1, which is an example for helping to understand the present invention, and the scope of the present invention is not limited thereto.

TABLE 1

| Raw material name | First resin | Second resin |
|---|---|---|
| Soybean Oil Fatty Acids (SOFA) | 50.7 | 49 |
| Pentaerythritol | 18.1 | 20 |
| Catalyst (DBTDL) | 0.3 | 0.3 |
| Phthalic Anhydride | 14.4 | 16.7 |
| DMC | 16.4 | 16.3 |
| Alkyd Resin Total | 100 | 100 |
| TDI | 12 | |
| IPDI | | 15 |
| Z-6018 | | 27 |
| TIPT | | 0.01 |
| IP CLEAN LX | 30 | 30 |

Preparation of the Coating Composition

The first resin, the second resin, the solvent, the fluidity control agent, the metal catalyst, and the additive were added to the glass container in the amount shown in Table 2 below and stirred to complete the coating composition.

TABLE 2

| Raw material name | Example 1 | Example 2 | Example 3 | Example 4 | Comparative Example 1 | Comparative Example 2 | Comparative Example 3 | Comparative Example 4 |
|---|---|---|---|---|---|---|---|---|
| First resin | 40 | 52 | 48 | 48 | 40 | — | 60 | 20 |
| Second resin | 20 | 8 | 12 | 12 | 20 | 60 | — | 40 |
| Carbon-based solvent | 28.28 | 28.48 | 31.88 | 28.28 | 34.58 | 32.98 | 29.78 | 5.28 |
| Ketone-based solvent | 2 | 2 | 2 | 2 | 2 | 2 | 2 | 10 |
| Alcohol-based solvent | 0.2 | | 0.1 | 0.2 | 5 | 8 | 12 | 15 |
| UV sensitizer | 0.02 | 0.02 | 0.02 | 0.02 | 0.02 | 0.02 | 0.02 | 0.02 |
| Fluidity adjusting agent 1 | 3 | 3 | 3 | — | — | — | 3 | — |
| Fluidity adjusting agent 2 | — | — | — | 3 | — | — | — | — |

TABLE 2-continued

| Raw material name | Example 1 | Example 2 | Example 3 | Example 4 | Comparative Example 1 | Comparative Example 2 | Comparative Example 3 | Comparative Example 4 |
|---|---|---|---|---|---|---|---|---|
| Surface conditioning resin | 3 | 3 | — | 3 | — | 3 | 3 | — |
| Antifoaming agent 1 | 1 | 1 | 1 | 1 | 1 | 1 | 1 | 1 |
| Antifoaming agent 2 | 0.5 | 0.5 | — | 0.5 | 0.5 | 0.5 | 0.5 | 0.5 |
| Antifoaming agent 3 | 0.2 | 0.2 | 0.2 | 0.2 | 0.2 | 0.2 | 0.2 | 0.2 |
| Metal catalyst 1 | — | — | 0.3 | — | 1.7 | 0.3 | 0.5 | — |
| Metal catalyst 2 | 1.8 | 1.8 | 1.5 | 1.8 | — | — | — | 1.7 |
| Flame retardant | — | — | — | — | — | — | — | 0.3 |
| Total | 100 | 100 | 100 | 100 | 100 | 100 | 100 | 100 |

The unit of each numerical value in Table 2 above is a gram.

The carbon-based solvent was a naphthene-based solvent, and the flashpoint was a temperature of 74° C., and a purified hydrocarbon-based solvent corresponding to the CAS Number 64742-47-8 was used.

As a ketone-based solvent, dimethyl carbonate, which corresponds to CAS 616-38-6, was used.

As an alcohol-based solvent, CAS No. 107-98-2 of methoxy propanol and CAS No. 112-34-5 of butyl carbitol were used.

As the UV sensitizer, a commercially available UV Tex OB product was used.

The fluidity control agent 1 is an ionized calcium mixture that can control fluidity through hydrogen bonding, and ionic bonding between molecules, a product of PCAS Co. was used.

For fluidity control agent 2 BYK products, which are urea-modified and non-polyamide products, were applied.

As the surface conditioning resin, an SK resin manufactured by EVONIC, which was a high molecular polyester resin, was used.

As antifoaming agents 1, 2, and 3, A-2503, A-2148, and A-3239 manufactured by AFCONA Co. were used, respectively.

Metal catalyst 1 was a commonly used cobalt type, and cobalt-naphthenate products from Jinyang Chemical Co. were used.

Metal Catalyst 2 was a mixed type, Co-Octoate and Zr-Octoate catalyst products from Jinyang Chemical Co. were used.

As flame retardants, trialkyl phosphate and DODP were used. In addition, phosphorus-based flame retardants such as triphenyl phosphate, triaryl phosphate, RDP, and metal-based flame retardants such as aluminum hydroxide, TBBPA, and Fyrol PMP may be used.

The coating compositions of Examples 1 to 4 and Comparative Examples 1 to 4 were coated on an IPC-B-25A multi-purpose single-sided test board (FR-4 material) to have a thickness of 60 μm to 100 μm to prepare a specimen. This specimen was dried at a temperature of 50° C. to 60° C. for 3 minutes and at a temperature of 80° C. for 20 minutes, then cured at 50% relative humidity for 7 days and tested as shown in Table 3 below.

TABLE 3

| | Example 1 | Example 2 | Example 3 | Example 4 | Comparative Example 1 | Comparative Example 2 | Comparative Example 3 | Comparative Example 4 |
|---|---|---|---|---|---|---|---|---|
| Solid content | 48 | 45 | 45 | 45 | 48 | 83 | 65 | 45 |
| Specific gravity | 0.97 | 0.97 | 0.97 | 0.97 | 0.97 | 1.01 | 0.98 | 1.05 |
| Viscosity | 150 cps | 150 cps | 150 cps | 150 cps | 150 cps | 150 cps | 150 cps | 150 cps |
| Insulation securing time | within 16 minutes | within 4 minutes | within 12 minutes | within 14 minutes | 24 minutes | 30 minutes | 44 minutes | 92 minutes |
| Insulation resistance | PASS | PASS | PASS | PASS | PASS | PASS | PASS | PASS |
| Curing time | 9 days | 9 days | 7 days | 9 days | 12 days | 20 days | 18 days | 9 days |
| Hardness (7 days elapsed) | 84 | 82 | 87 | 80 | 62 | 55 | 43 | 82 |
| Peel strength (1 day) | 41 | 40 | 43 | 45 | 32 | 28 | 29 | 20 |
| Flexibility | PASS | PASS | PASS | PASS | PASS | PASS | PASS | PASS |
| Wet insulation | PASS | PASS | PASS | PASS | PASS | FAIL | PASS | PASS |
| High temperature and humidity | PASS | PASS | PASS | PASS | PASS | FAIL | FAIL | PASS |
| Salt water spray | PASS | PASS | PASS | PASS | PASS | FAIL | FAIL | PASS |
| High temperature storage | PASS | PASS | PASS | PASS | PASS | FAIL | PASS | PASS |
| Lead part Film thickness | PASS | PASS | PASS | PASS | PASS | FAIL | PASS | FAIL |

TABLE 3-continued

| | Example 1 | Example 2 | Example 3 | Example 4 | Comparative Example 1 | Comparative Example 2 | Comparative Example 3 | Comparative Example 4 |
|---|---|---|---|---|---|---|---|---|
| High temperature operation evaluation | PASS | PASS | PASS | PASS | FAIL | FAIL | FAIL | FAIL |
| Low temperature operation evaluation | PASS | PASS | PASS | PASS | PASS | FAIL | FAIL | FAIL |
| Thermal shock | PASS | PASS | PASS | PASS | PASS | FAIL | FAIL | PASS |

The solid content was evaluated according to ASTM D2697, and the test results are measured values.

The specific gravity was evaluated according to ASTM D792, and the test results are measured values.

Viscosity was measured using a Brookfield viscometer according to ASTM D562, and the results are measured values. The insulation securing time was evaluated according to IEC 243, and the result is the time to reach 500MΩ at room temperature drying and is separately indicated in Table 5 below.

The curing time was described as the time until the coating film did not melt through the xylene drop test. After the 1T film was prepared and laminating the 1T film to a thickness of 5T, the hardness was measured with a 5T thickness coating film and was measured with a Shore hardness tester A type, and the measurement was described in the same manner at the time of the 7th day.

Peel strength was measured using a tensile strength meter 24 hours after coating on a 0.25T tin-plated steel sheet with a diameter of 25 mm and a contact area of 75 mm, and then the force (kgf) required for peeling was measured and described.

Insulation resistance was evaluated according to IEC 243, and if the measured value was 10Ω or more, it is PASS otherwise FAIL.

Flexibility was tested by its own test method, and the test result is presented as PASS or FAIL.

Wet insulation was evaluated according to the IPC-TM-650 test method, and after 72 hours, insulation resistance and appearance were evaluated, and the test result is presented as PASS or FAIL.

High temperature and high humidity were evaluated according to the IPC-TM-650 test method, and insulation resistance and appearance were evaluated after 500 hours elapsed, and the test result is presented as PASS or FAIL.

Saltwater spray was evaluated according to the ASTM B117 test method, and the test result is presented as PASS or FAIL.

The high-temperature storage test is evaluated according to JESD22-A102, and the test result is presented as PASS or FAIL.

The lead part coating film thickness was tested by a self-testing method, and the IC chip part of the coated substrate was cut and cold mounted with two-component epoxy transparent resin, and the lead part coating film thickness was measured. The result is presented as PASS or FAIL.

High-temperature operation evaluation is a vehicle evaluation method that evaluates whether each circuit operates normally after coating ten or more sheets on the mounting board and after a high temperature of 80° C. The test result is presented as PASS or FAIL.

Low-temperature operation evaluation is a vehicle evaluation method that evaluates whether each circuit operates normally after coating ten or more sheets on the mounting board at room temperature. The test result is presented as PASS or FAIL.

Thermal shock is a vehicle evaluation method. After coating the mounting board, 500 cycles are performed in one cycle for 70 minutes, such as −40° C. to 125° C., 30 minutes at high temperature, 5 minutes at room temperature, 30 minutes at low temperature, etc. The test result is presented as PASS or, FAIL.

As shown in Table 3, the coating composition according to the Example of the present invention was able to obtain many superior results compared to the Comparative Example in VOCs and lead part coating film thickness.

In addition, even though the discrimination force is low on a standard board. In the case of evaluation on the mounting board, if the lead part coating film was insufficient, it was inferior at high temperature and high humidity for a long period of time. Therefore, it is possible to obtain favorable results for tin whiskers due to the growth of lead in the welding part due to insufficient coating film. In addition, the test piece, according to the Example of the present invention, was significantly superior in hardness after curing compared to general silicone products, and since the final molecular weight grew to hundreds or greater, it showed excellent properties in terms of long-term durability.

Although the present invention has been described in diagrams as described above, it is not limited to the described embodiments, and it can be said that it is conventional for a person those of ordinary skilled in the field of this technology that various modifications and variations can be made without departing from the spirit and scope of the present invention. Accordingly, examples of such modifications or variations shall fall within the scope of the claims of the present invention. The scope of the present invention should be construed based on the appended claims.

What is claimed is:

1. A protective coating composition for an electronic board, comprising:
    a first resin comprising a first urethane-modified alkyd resin;
    a second resin synthesized through a polymerization of second urethane-modified alkyd resin and a silicone resin;
    a solvent comprising carbon-based solvents, ketone-based solvents, alcohol-based solvents, or combinations thereof;
    a fluidity control agent; and
    a metal catalyst,
    the protective coating composition optionally comprising a flame retardant, wherein the fluidity control agent comprises a micronized calcium dispersion, urea-modified polyimide, or combinations thereof.

2. The protective coating composition of claim 1, wherein the first urethane-modified alkyd resin is obtained by polymerizing an alkyd resin obtained from polymerizing fatty acid, polybasic acid, and polyhydric alcohol and an isocyanate.

3. The protective coating composition of claim 1, wherein the first resin has an acid value of 25 mgKOH/g to 35 mgKOH/g and a mass average molecular weight of 10,000 g/mol to 15,000 g/mol.

4. The protective coating composition of claim 1, wherein the first resin has a Gardner viscosity of level W to Z and a solid content of 50% to 80% by weight based on the total weight of the total weight of the first resin.

5. The protective coating composition of claim 1, wherein the second resin has an acid value of 3mgKOH/g to 10mgKOH/g and a mass average molecular weight of 8,000 g/mol to 30,000 g/mol.

6. The protective coating composition of claim 1, wherein the second resin has a Gardner viscosity level of W to Z1 and a solid content of 60% to 90% by weight based on the total weight of the second resin.

7. The protective coating composition of claim 1, wherein the second resin comprises an amount of 20 parts to 40 parts by weight of a silicone resin to 100 parts by weight of the second urethane-modified alkyd resin.

8. The protective coating composition of claim 1, wherein the carbon-based solvent comprises naphthene-based hydrocarbons, paraffin-based hydrocarbons, or combinations thereof.

9. The protective coating composition of claim 1, wherein the carbon-based solvent has a flashpoint of 0° C. to 80° C.

10. The protective coating composition of claim 1, wherein the carbon-based solvent comprises a naphthene-based hydrocarbon having a volatilization temperature of 40° C., 48° C., or 56° C.

11. The protective coating composition of claim 1, wherein the carbon-based solvent comprises a paraffin-based hydrocarbon comprising C10-C12 isoparaffins, C12-C13 isoparaffins, C10-C13 normal paraffins, or combinations thereof.

12. The protective coating composition of claim 1, wherein the ketone-based solvent comprises methyl ethyl ketone, methyl isobutyl ketone, acetone, dimethyl carbonate, or combinations thereof.

13. The protective coating composition of claim 1, wherein the alcohol-based solvent comprises isopropyl alcohol, methanol, methoxy propanol, or combinations thereof.

14. The protective coating composition of claim 1, wherein the alcohol-based solvent has a dielectric constant of 5 or greater.

15. The protective coating composition of claim 1, wherein the metal catalyst comprises cobalt naphthenate, calcium octoate, zirconium octoate, or combinations thereof.

16. The protective coating composition of claim 1, the composition comprising:
an amount of 20% to 60% by weight of the first resin;
an amount of 8% to 60% by weight of the second resin;
an amount of 5% to 35% by weight of the carbon-based solvent;
an amount of 1% to 3% by weight of the ketone-based solvent;
an amount of 0% to 15% by weight of the alcohol-based solvent;
an amount of 0% to 0.2% by weight of a UV sensitizer;
an amount of about 01% to 3% by weight of the fluidity control agent;
an amount of 0% to 3% by weight of a surface conditioning resin;
an amount of 0.2% to 3% by weight of an antifoaming agent; and
an amount of 0.3% to 2% by weight of the metal catalyst,
all the % by weight based on the total weight of the protective coating composition.

17. A method for preparing a protective coating composition for an electronic board, comprising:
preparing a first resin comprising a first urethane-modified alkyd resin, by (i) polymerizing fatty acid, polybasic acid, and polyhydric alcohol to obtain a first alkyd resin, and (ii) polymerizing the alkyd resin and an isocyanate;
preparing a second resin by (i) polymerizing fatty acid, polybasic acid, and polyhydric alcohol to obtain a second alkyd resin, (ii) polymerizing the second alkyd resin and an isocyanate to prepare a urethane-modified alkyd resin, and (iii) polymerizing the second urethane-modified alkyd resin with a silicone resin; and
adding the first resin, a second resin, a fluidity control agent, and a metal catalyst to a solvent comprising a carbon-based solvent, a ketone-based solvent, an alcohol-based solvent, or combinations thereof, and stirring the mixture;
wherein the fluidity control agent comprises a micronized calcium dispersion, urea-modified polyimide, or combinations thereof.

18. A method of manufacturing an electronic board, comprising:
applying the protective coating composition of claim 1 on a board; and
drying the applied coating composition to form a coating layer on the board.

19. A method of manufacturing an electronic board, comprising:
applying the protective coating composition of claim 1 on a board and;
curing the applied protective coating composition by applying hot air to the applied coating composition to form a coating layer on the board.

* * * * *